United States Patent
Sohn et al.

(10) Patent No.: US 8,358,007 B2
(45) Date of Patent: Jan. 22, 2013

(54) INTEGRATED CIRCUIT SYSTEM EMPLOYING LOW-K DIELECTRICS AND METHOD OF MANUFACTURE THEREOF

(75) Inventors: Dong Kyun Sohn, Gyeonggi-Do (KR); Wuping Liu, Singapore (SG); Fan Zhang, Singapore (SG); Juan Boon Tan, Singapore (SG); Jing Hui Li, Singapore (SG); Bei Chao Zhang, Singapore (SG); Luying Du, Singapore (SG); Wei Liu, Singapore (SG); Yeow Kheng Lim, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 99 days.

(21) Appl. No.: 12/796,610

(22) Filed: Jun. 8, 2010

(65) Prior Publication Data

US 2010/0314763 A1 Dec. 16, 2010

Related U.S. Application Data

(60) Provisional application No. 61/186,365, filed on Jun. 11, 2009.

(51) Int. Cl.
*H01L 23/48* (2006.01)
*H01L 21/768* (2006.01)

(52) U.S. Cl. ........ 257/741; 438/637; 438/666; 438/692; 257/774; 257/E21.585; 257/E21.576; 257/E23.011

(58) Field of Classification Search ............ 257/741, 257/774, E21.585, E21.576, E23.011; 438/637, 438/666, 692

See application file for complete search history.

(56) References Cited

U.S. PATENT DOCUMENTS

| | | | |
|---|---|---|---|
| 6,589,874 B2 | 7/2003 | Andricacos et al. | |
| 6,800,554 B2 * | 10/2004 | Marieb et al. | 438/687 |
| 6,998,343 B1 * | 2/2006 | Sun et al. | 438/659 |
| 7,268,071 B2 * | 9/2007 | Minami | 438/637 |
| 7,492,030 B2 | 2/2009 | Bhattacharyya et al. | |
| 2006/0154471 A1 * | 7/2006 | Minami | 438/618 |
| 2006/0286797 A1 | 12/2006 | Zhang et al. | |
| 2007/0042580 A1 | 2/2007 | Al-Bayati et al. | |
| 2008/0230907 A1 | 9/2008 | Liu et al. | |

* cited by examiner

*Primary Examiner* — Calvin Lee
*Assistant Examiner* — Monica D Harrison
(74) *Attorney, Agent, or Firm* — Mikio Ishimaru

(57) ABSTRACT

A method of manufacture of an integrated circuit system includes: fabricating a substrate having an integrated circuit; applying a low-K dielectric layer over the integrated circuit; forming a via and a trench, in the low-K dielectric layer, over the integrated circuit; forming a structure surface by a chemical-mechanical planarization (CMP) process; and applying a direct implant to the structure surface for forming an implant layer and a metal passivation layer including repairing damage, to the low-K dielectric layer, caused by the CMP process.

19 Claims, 6 Drawing Sheets

INTEGRATED CIRCUIT SYSTEM EMPLOYING LOW-K DIELECTRICS AND METHOD OF MANUFACTURE THEREOF

CROSS-REFERENCE TO RELATED APPLICATION

This application claims the benefit of U.S. Provisional Patent Application Ser. No. 61/186,365 filed Jun. 11, 2009, and the subject matter thereof is incorporated herein by reference thereto.

TECHNICAL FIELD

The present invention relates generally to an integrated circuit system, and more particularly to an integrated circuit system employing low-k dielectrics.

BACKGROUND ART

Integrated circuits find application in many of today's consumer electronics, such as cell phones, video cameras, portable music players, printers, computers, location based devices, etc. Integrated circuits may include a combination of active devices, passive devices and their interconnections.

The ever increasing demand for higher density and higher performance integrated circuits has driven the market to seek the production of sub-micron sized low resistance metallization patterns, such as a copper interconnect. Unfortunately, one of the major challenges of copper metallurgy is that it cannot be easily patterned by regular plasma etching techniques. To overcome this problem, the circuit designers have implemented damascene processes that form the necessary copper vias and interconnects within an integrated circuit.

The damascene process typically starts with deposition of a dielectric material that is patterned and etched to form holes or trenches within the dielectric. These holes or trenches are then filled with a blanket deposit of metal, which is then planarized down to the dielectric to define the metal interconnects within the dielectric. Typically, the excess metal material formed over the dielectric is removed by a chemical mechanical planarization (CMP) process. Unfortunately, CMP processes and photoresist patterning can be damaging to soft, low-modulus, and porous low-K dielectric layers. Thus, many previous methodologies have employed the extra step of forming a hard mask layer to protect these low-K dielectric layers, but this can raise the overall effective dielectric constant (K) of the insulating material. Any increase in the effective dielectric constant (K) defeats the purpose of using the low-K dielectric layer in the first place, which is to reduce the capacitance of the layer to better isolate the metal structures in the layer.

Other attempts to improve copper interconnect reliability have focused on copper surface passivation. This technique typically employs a chemically-vapor deposited (CVD) thin dielectric layer atop of a polished copper interconnect. Generally, the thin dielectric may include silicon nitride or nitrogen-doped silicon carbide, wherein nitrogen-doped silicon carbide has replaced silicon nitride since 90 nm onwards due to capacitance requirements and process control. Unfortunately, CVD passivation of copper interconnects has failed to provide sufficient reliability margin as the technology nodes continue to decrease.

Thus, a need still remains for a reliable integrated circuit system, method of fabrication, and device design, wherein the integrated circuit system exhibits improved metal interconnect reliability. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: fabricating a substrate having an integrated circuit; applying a low-K dielectric layer over the integrated circuit; forming a via and a trench, in the low-K dielectric layer, over the integrated circuit; forming a structure surface by a chemical-mechanical planarization (CMP) process; and applying a direct implant to the structure surface for forming an implant layer and a metal passivation layer including repairing damage, to the low-K dielectric layer, caused by the CMP process.

The present invention provides an integrated circuit system including: a substrate having an integrated circuit; a low-K dielectric layer applied over the integrated circuit; a via and a trench over the integrated circuit; a structure surface formed, by a chemical-mechanical planarization (CMP) process, on the via, the trench, and the low-K dielectric layer; and an implant layer and a metal passivation layer formed by a direct implant through the structure surface.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
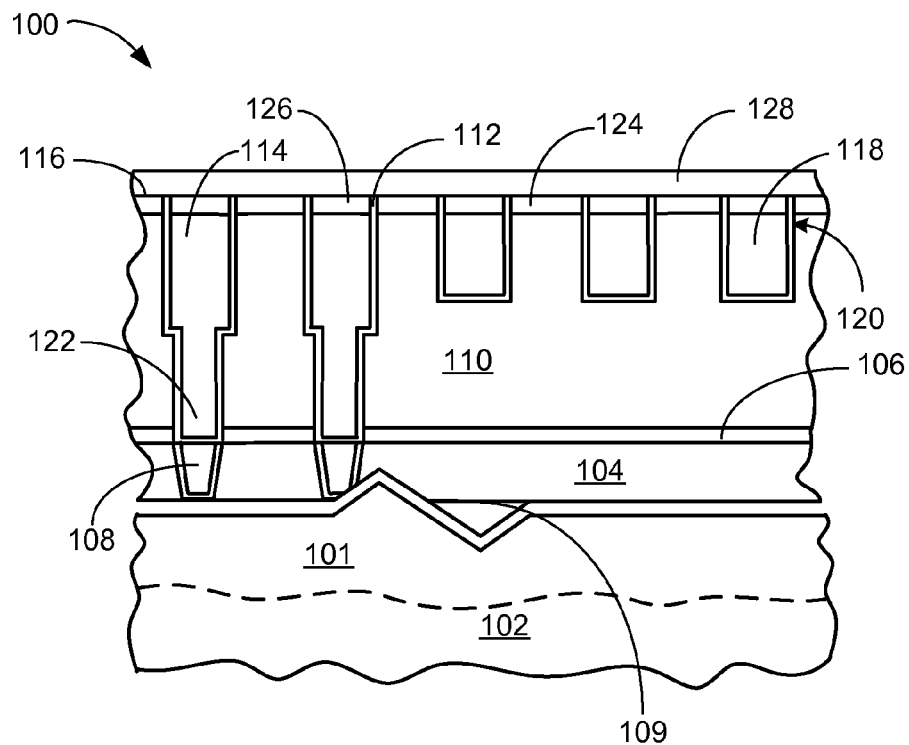
FIG. 1 is a partial cross-sectional view of an integrated circuit system with low-K dielectric, in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. For expository purposes, the term "horizontal" as used herein is defined as a plane parallel to the plane or top surface of the chemically mechanically planarized surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening material.

The term "processing" as used herein includes deposition of material or photoresist, patterning, exposure, development, etching, cleaning, and/or removal of the material or photoresist as required in forming a described structure. The term "planarization" means a chemical and mechanical polishing process used to provide a planar surface among multiple materials.

The terms "example" or "exemplary" are used herein to mean serving as an instance or illustration. Any aspect or embodiment described herein as an "example" or as "exemplary" is not necessarily to be construed as preferred or advantageous over other aspects or designs.

Generally, the following embodiments relate to a device, system, or method of surface implantation to enhance the reliability of copper interconnects within low-K dielectric material. By use of the proposed method, passivation of both the dielectric and the copper interconnect can be achieved, with expectation of a quality interface between a local dielectric, such as a low-k dielectric material, surrounding the copper interconnect and the upper/cap layer. In at least one embodiment, the enhanced surface passivation technique will improve time-dependent-dielectric-breakdown (TDDB) and electro-migration (EM) performance.

Moreover, it is to be appreciated that the integrated circuit system of the present disclosure may further include any number of active device structures and/or passive device structures. Exemplary illustrations of devices within the integrated circuit system may include processor components, memory components, logic components, digital components, analog components, mixed-signal components, power components, radio-frequency (RF) components (e.g., RF CMOS circuits), digital signal processor components, resistor components, inductor components, capacitor components, microelectromechanical components, optical sensor components, and so forth, in numerous configurations and arrangements as may be needed. Furthermore, by way of example, the integrated circuit system may also be part of a back-end-of-line vertical natural capacitor (VNCAP) structure.

Furthermore, it is to be understood that one or more of the integrated circuit system could be prepared at one time on a medium, which could be separated into individual or multiple integrated circuit package assemblies at a later stage of fabrication.

Referring now to FIG. 1, therein is shown a partial cross-sectional view of an integrated circuit system 100 with low-K dielectric, in an embodiment of the present invention. The partial cross-sectional view of the integrated circuit system 100 depicts an integrated circuit 101 fabricated on a substrate 102, such as a semiconductor substrate, a glass substrate, a thin-film substrate, or the like.

An inter-level dielectric layer 104 is deposited over the integrated circuit 101 and is covered by a cap layer 106, such as silicon nitride (SiN), carbon-doped Silicon nitride, or nitrogen-doped silicon carbide (nBlok). An interconnect 108, such as a copper interconnect, is electrically connected to the integrated circuit 101 through a contact layer 109.

A low-K dielectric layer 110, such as a low-K dielectric material or an ultra low-K dielectric material, is deposited over the inter-level dielectric layer 104 and the cap layer 106. The inter-level dielectric layer 104 and the low-K dielectric layer 110 are substantially similar in the chemical make-up and dielectric value (K).

The inter-level dielectric layer 104 may have dielectric constants from 4.2 to 3.9 and may be composed of materials such as silicon oxide ($SiO_x$), tetraethylorthosilicate (TEOS), borophosphosilicate (BPSG) glass, etc. The low-K dielectric material may have lower dielectric constants from 3.9 to 2.5 and may be composed of materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), etc. The ultra low-K dielectric material may have ultra-low dielectric constants below 2.5 and may be composed of such materials as polytetrafluoroethylene (PTFE) commercially available as Teflon-AF and Teflon microemulsion, polyimide nanofoams such as polypropylene oxide, silica aerogels, silica xerogels, and mesoporous silica.

A diffusion barrier layer 112, such as a seed metal layer which is deposited on the low-K dielectric layer 110, and inside the patterned interconnect openings. The diffusion barrier layer 112 may include an initial 50-200 Angstrom layer of titanium (Ti), tantalum (Ta) or tantalum nitride (TaN), used as a diffusion barrier, that is covered by a 300-2000 Angstrom layer of copper (Cu). An interconnect metal 114, such as copper, is deposited on the diffusion barrier layer 112. A structure surface 116 is formed by a chemical-mechanical polish establishing a coplanar surface between the interconnect metal 114 and the low-K dielectric layer 110.

A trench 118 may be produced during a reactive ion etch process to be filled with the interconnect metal 114. The low-K dielectric layer 110 allows the forming of a vertical sidewall 120 on a via 122, the trench 118, or a combination thereof. An implantation layer 124 may be formed by implanting a dopant in the low-K dielectric layer 110. Likewise a metal passivation layer 126 may be formed on the interconnect metal 114, concurrently with or separately from the implantation layer 124, by the implanting of the dopant. The implantation layer 124, the metal passivation layer 126, or a combination thereof can be below the structure surface 116 and extend up to the structure surface 116.

By way of example, the implantation layer 124 may include dopants, such as inert elements (e.g., helium (He)), electron scavengers (e.g., carbon (C), boron (B), and similar elements.), and/or negative elements (e.g., nitrogen (N), phosphorus (P), arsenic (As), and similar elements). In such cases, the dopant selection can be based upon minimum damage or impact to the low-K dielectric layer 110, low-K dielectric material damage recovery, and/or a minimization of the change of the dielectric constant (K) value of the low-K dielectric layer 110.

It is to be understood that the implantation layer 124 or the dopant profile within the low-K dielectric layer 110 can be adjusted and/or modulated by altering the implant energy, dose, and/or angle to achieve an implantation depth of between 5 Angstroms and 500 Angstroms, with a preferred or target range between 15 Angstroms and 150 Angstroms. By way of another example, the implant energy may vary from about 1 K eV to about 1 M eV and the implant dose may vary from about $1 \times 10^{12}$ to about $1 \times 10^{18}$ ions/cm$^2$.

It is also to be understood that the metal passivation layer 126 may be adjusted by the mechanism for adjusting the implantation layer 124 discussed above. The range of thickness for the metal passivation layer 126 may extend from 5 Angstroms to 250 Angstroms, with a preferred or target range between 15 Angstroms and 50 Angstroms.

In such cases, the concentration of the dopant within the implantation layer 124 and the metal passivation layer 126 may range from about 1 part per billion to about 1000 parts per million. However, it will be appreciated by those skilled in the art that the implant can be tuned to only dope the low-K dielectric layer 110, thus forming the implantation layer 124, with a dopant range from about 1 part per billion to about 1000 parts per million. In at least one embodiment, the implant energy may preferably vary between about 5 keV to about 20 keV when a dielectric capping layer 128 is present.

It will also be appreciated by those skilled in the art that the implant may alter the top surface of the interconnect metal 114, to help prevent corrosion and/or erosion of the interconnect metal 114. In such cases, a carbon or nitrogen implant into the top surface of the interconnect metal 114 can help to passivate the interconnect metal 114, forming the metal passivation layer 126, and help to prevent corrosion and/or erosion. By way of example, it is to be understood that the top surface of the integrated circuit system 100 can be subject to moisture absorption and that a subsequent implantation process can help to remove moisture contaminants, such as a copper oxide, which could otherwise detrimentally affect reliability.

Generally, the implantation can form the implantation layer 124, within the low-K dielectric layer 110, or the metal passivation layer 126 with a depth in the range of about 5 angstroms to about 500 angstroms and preferably having a range between about 15 angstroms to about 150 angstroms. It will be appreciated by those skilled in the art that by implanting the implantation layer 124 through the dielectric capping layer 128 that the implant may cause an inter-mixing of the dielectric capping layer 128 and the low-K dielectric layer 110 in the implantation layer 124.

It has been discovered that this inter-mixing of the low-K dielectric layer 110 and the dielectric capping layer 128 produces a firm interface region within the implantation layer 124 that helps to improve the time dependent dielectric breakdown (TDDB) of the low-K dielectric layer 110. It has also been discovered that the intermixing of the dielectric capping layer 128 and the low-K dielectric layer 110 produces the implantation layer 124 that helps to repair the damage caused by the chemical mechanical planarization (CMP) process. The dielectric capping layer 128 may have a thickness range of between 100 Angstroms and 500 Angstroms, with a preferred or target thickness in the range of 150 Angstroms and 350 Angstroms.

It will be appreciated by those skilled in the art that the present embodiment permits a self-aligned passivation for the implantation layer 124 and the metal passivation layer 126 passivation to be implanted separately. For example, by selectively forming the metal passivation layer 126 on the interconnect metal 114 before the dielectric implantation, the implanted dopant can then be selectively introduced into the dielectric areas, thereby achieving a "self-aligned dielectric passivation" process.

Figure 2:
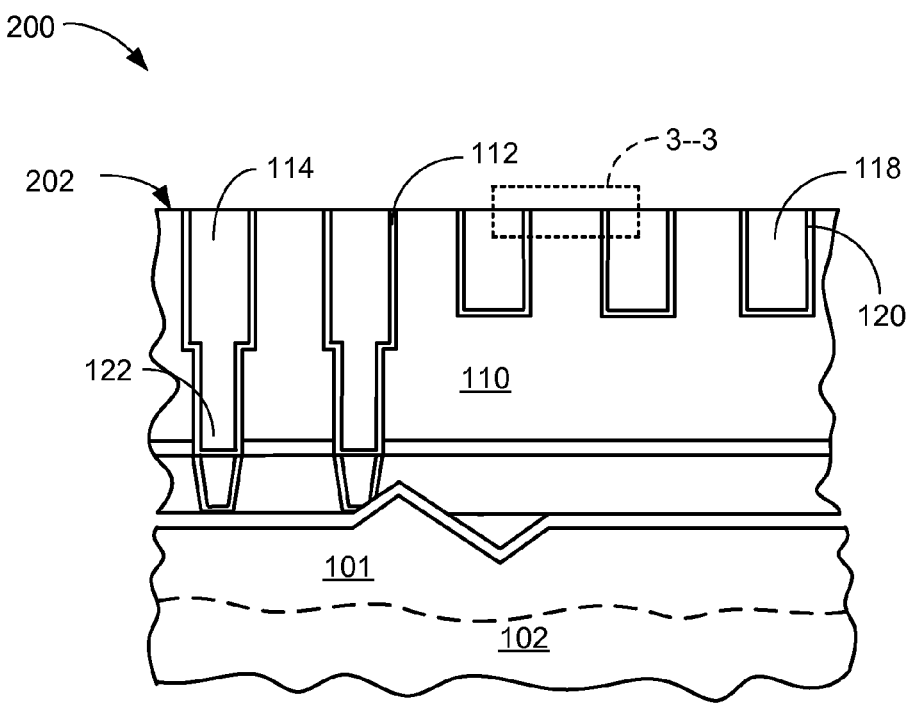
FIG. 2 is a partial cross-sectional view of an integrated circuit system with low-K dielectric, in a chemical-mechanical planarization (CMP) process phase of manufacturing.

Referring now to FIG. 2, therein is shown a partial cross-sectional view of an integrated circuit system 200 with low-K dielectric, in a chemical-mechanical planarization (CMP) process phase of manufacturing. The partial cross-sectional view of the integrated circuit system 200 depicts a structure surface 202 that is formed by a chemical-mechanical polish establishing a coplanar surface across the top surface of the low-K dielectric layer 110, the diffusion barrier layer 112, and the interconnect metal 114.

The integrated circuit system 200 may include one or more metallization structures, such as the trench 118, the via 122, or metallization layers (not shown), formed within one or more of the low-K dielectric layer 110, such as an inter metal dielectric layer, a hard mask layer, a low-k dielectric layer, or an ultra low-k dielectric layer. By way of example, the metallization structures may include low resistance materials, such as copper, and the low-K dielectric layer 110 may include BLACK DIAMOND™ silicon oxide-based CVD low-K film available from Applied Materials or CORAL™ low-K dielectric film available from Novellus Systems Inc. In at least one embodiment, the one or more metallization layers and the one or more of the low-K dielectric layer 110 can be formed over the substrate 102 as part of a metallization level, a local interconnect, or as part of a VNCAP structure coupled to the integrated circuit 101.

The structure surface 202 of the integrated circuit system 200 can be planarized via a chemical mechanical planarization (CMP) process. In at least one embodiment, the structure surface 202 can be substantially coplanar across the top surface of the low-K dielectric layer 110, the diffusion barrier layer 112, and the interconnect metal 114. Subsequent to performing the CMP process, the structure surface 202 may include a chemical slurry residue (not shown) from the slurry used during chemical mechanical planarization.

It will be appreciated by those skilled in the art that the chemical slurry residue can detrimentally affect the electrical reliability characteristics of the integrated circuit system 200, such as the time dependent dielectric breakdown (TDDB) of the low-K dielectric layer 110. For example, slurry components and acidity can affect the passivation of the structure surface 202 for both the implantation layer 124, of FIG. 1, and the metal passivation layer 126, of FIG. 1, local metal/dielectric profiles, global topography and reliability performance (e.g., both time dependent dielectric breakdown and electro-migration). In at least one embodiment, the porosity of the low-K dielectric layer 110 can increase the absorption of the chemical slurry by the structure surface 202 in the region intended for the implantation layer 124.

Generally, the dielectric material separating the interconnect metal 114 at the structure surface 202 may include a low-K dielectric material or an ultra low-K dielectric material and is generally known as the low-K dielectric layer 110. Notably, the structure surface 202 of the integrated circuit system 200 does not include an additional dielectric layer (e.g., a hard mask layer) formed over the low-k dielectric material to protect the low-k dielectric material during CMP. It will be appreciated by those skilled in the art that the additional dielectric layer formed over the low-K dielectric layer 110 to protect the low-K dielectric layer 110 during CMP can increase the effective dielectric constant (K) of the structure.

Moreover, it will be appreciated by those skilled in the art that the low-K dielectric layer 110 subject to a CMP process will typically experience CMP scratching, surface dishing, and/or surface erosion that will detrimentally affect the electrical reliability characteristics of the integrated circuit system 200, such as the TDDB of the low-K dielectric layer 110. Additionally, it will be appreciated by those skilled in the art that damage of the low-k dielectric layer 110 caused by the CMP may also alter the capacitance, leakage current, and/or electro-migration characteristics of the integrated circuit system 200.

Figure 3:
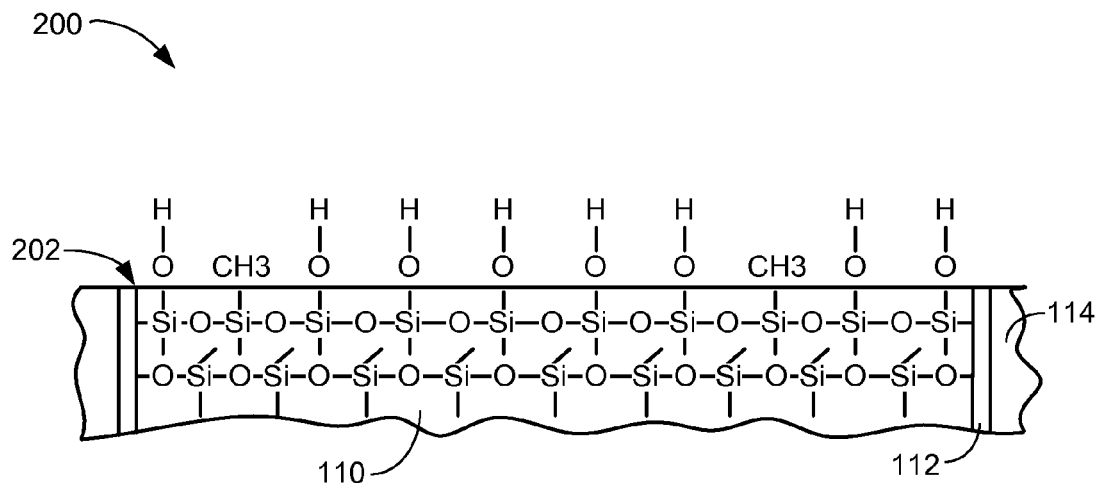
FIG. 3 is a schematic of the chemical bonds at a segment of the structure surface of the integrated circuit system, of FIG. 2, in a post-planarization phase of manufacturing.

An outlined box 3-3 depicts a segment of the structure surface 202 as shown in FIG. 3 below. The segment generally represents the surface state of the structure surface after the planarization process.

Referring now to FIG. 3, therein is shown a schematic of the chemical bonds at a segment of the structure surface 202 of the integrated circuit system 200, of FIG. 2, in a post-planarization phase of manufacturing. The schematic of the chemical bonds at the segment of the structure surface 202 depicts the low-K dielectric layer 110 bounded on the horizontal ends by the diffusion barrier layer 112 and the interconnect metal 114. It is noted that the interconnect metal 114 may represent the via 122, of FIG. 1, or the trench 118, of FIG. 1, or a combination thereof.

As an example only, the low-K dielectric layer 110 is shown to be comprised of silicon oxide ($SiO_x$). The actual material used in the low-K dielectric layer 110 may present more complicated chemical bonds than are shown by the silicon oxide. The surface bonds of the silicon oxide are representative of the types of bonds seen with other dielectric materials.

At the structure surface 202 a combination of substitute silyl radicals ($SiCH_3$) and silicon hydroxide (SiOH) may be formed as a result of the compounds used in the CMP phase of manufacturing. Left unchecked, these chemical bonds can combine through the addition of moisture to form various acids that may detrimentally impact the low-K dielectric layer 110 by altering the capacitance of the dielectric material and attracting additional moisture into the structure surface 202.

It will be appreciated by those skilled in the art that the current illustration depicts an exemplary schematic of the bonding state and/or chemical bonds at the structure surface 202 and/or layers of the integrated circuit system 200 after planarization or polishing. Silicon hydroxide (Si—O—H) bonding is understood to be the dominant state for the low-k dielectric layer 110 that is freshly polished and occurrences of the substitute silyl radicals ($SiCH_3$) may result from the residual slurry used during the planarization process.

Figure 4:
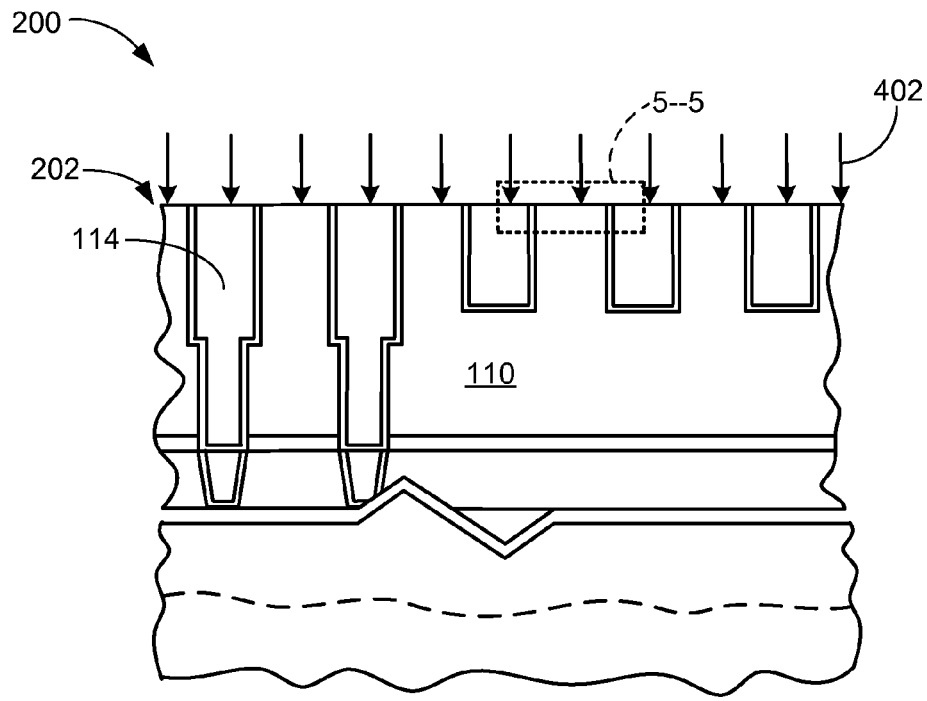
FIG. 4 is a partial cross-sectional view of the integrated circuit system, of FIG. 2, with low-K dielectric, in a dopant implant phase of manufacturing.

Referring now to FIG. 4, therein is shown a partial cross-sectional view of the integrated circuit system 200, of FIG. 2, with low-K dielectric, in a dopant implant phase of manufacturing. The partial cross-sectional view of the integrated circuit system 200 depicts the structure surface 202 that is subjected to a direct implant 402 which may alter the electrical reliability characteristics that may have been detrimentally affected by the CMP process upon the low-K dielectric layer 110.

By way of example, the direct implant 402 may include dopants, such as inert elements (e.g., helium), electron scavengers (e.g., carbon, boron, and similar elements.), and/or negative elements (e.g., nitrogen, phosphorus, arsenic, and similar elements). In such cases, the selection of the dopant for the direct implant 402 can be based upon minimum damage or impact that may have occurred to the low-K dielectric layer 110, low-K dielectric material damage recovery, and/or a minimization of the change of the dielectric constant value of the low-K dielectric material.

It is to be understood that the implantation layer 124, of FIG. 1, or dopant profile within the implantation layer 124 and the metal passivation layer 126, of FIG. 1, can be adjusted and/or modulated by altering the implant energy, dose, and/or angle. By way of example, the implant energy may vary from about 1 keV to about 1 MeV and the implant dose may vary from about $1 \times 10^{12}$ to about $1 \times 10^{18}$ ions/cm$^2$.

In such cases, the concentration of the dopant within the implantation layer 124 and the metal passivation layer 126 may range from about 1 part per billion to about 1000 parts per million. In a representative embodiment, the implant energy may be less than about 5 keV when the direct implant 402 is utilized.

Generally, the implantation can form the implantation layer 124 and/or the metal passivation layer 126 with a depth of about 5 Angstroms to about 500 Angstroms and preferably between about 15 Angstroms to about 150 Angstroms. It will also be appreciated by those skilled in the art that the direct implant 402 may alter the top surface of the interconnect metal 114 to help prevent corrosion and/or erosion of the interconnect metal 114 during the expected life of the integrated circuit system 200.

In such cases, a carbon or nitrogen implant into the structure surface 202 of the interconnect metal 114 can help to passivate the interconnect metal 114 and help to prevent corrosion and/or erosion. By way of example, it is to be understood that the structure surface 202 of the integrated circuit system 200 can be subject to moisture absorption and that a subsequent implantation process can help to remove moisture contaminants, such as a copper oxide, which can detrimentally affect reliability.

Figure 5:
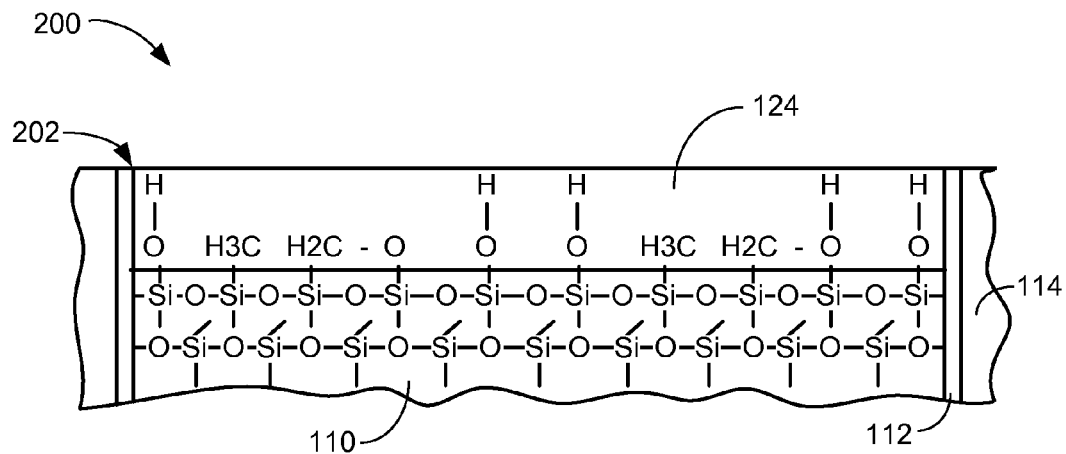
FIG. 5 is a schematic of the chemical bonds at a segment of the structure surface of the integrated circuit system, of FIG. 2, in a post-planarization and post-implantation phase of manufacturing.

An outlined box 5-5 depicts a segment of the structure surface 202 as shown in FIG. 5 below. The segment generally represents the surface state of the structure surface after the planarization process and application of the direct implant 402.

Referring now to FIG. 5, therein is shown a schematic of the chemical bonds at a segment of the structure surface 202 of the integrated circuit system 200, of FIG. 2, in a post-planarization and post-implantation phase of manufacturing. The schematic of the chemical bonds at a segment of the structure surface 202 depicts the low-K dielectric layer 110 bounded on the horizontal ends by the diffusion barrier layer 112 and the interconnect metal 114. It is noted that the interconnect metal 114 may represent the via 122, of FIG. 1, the trench 118, of FIG. 1, or a combination thereof.

As an example only, the low-K dielectric layer 110 is shown to be comprised of silicon oxide ($SiO_x$). The actual material used in the low-K dielectric layer 110 may present more complicated chemical bonds than are shown by the silicon oxide. The post-implantation bonds of the silicon oxide are representative of the types of bonds seen with other dielectric materials.

The implantation layer 124 may have been formed by the application of the direct implant 402, of FIG. 4, as discussed above. After the application of the direct implant 402, a combination of methylsilane ($SiCH_3$), silicon hydroxide (SiOH), and Silymethylsilatrane ($Si(OCH_2)$) may be present in the implantation layer 124. The compounds may generally be called Siloxanes which are hydrophobic and may prevent the penetration of moisture that would otherwise raise the capacitance of the low-K dielectric layer 110.

Figure 6:
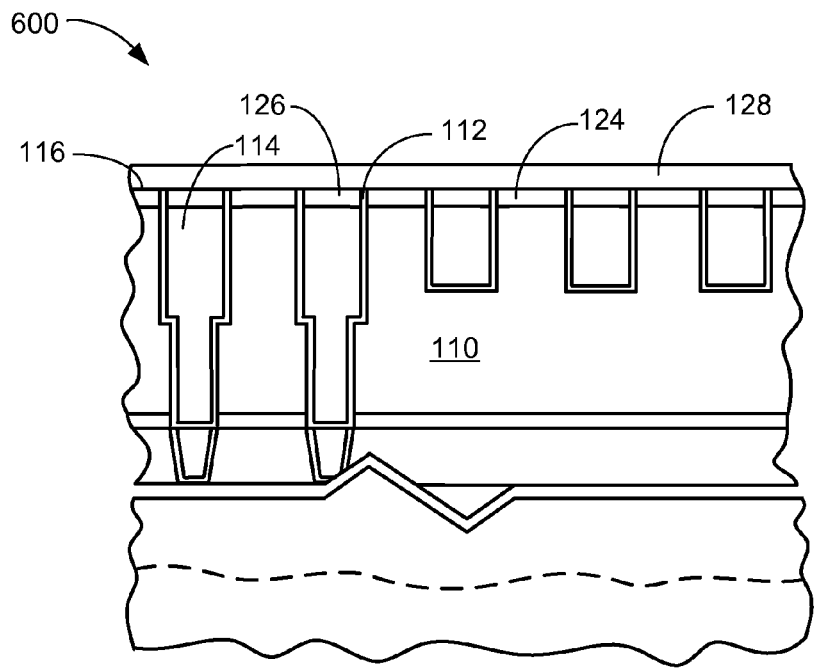
FIG. 6 is a partial cross-sectional view of an integrated circuit system with low-K dielectric, in an embodiment of the present invention.

Referring now to FIG. 6, therein is shown a partial cross-sectional view of an integrated circuit system 600 with low-K dielectric, in an embodiment of the present invention. The partial cross-sectional view of the integrated circuit system 600 depicts the integrated circuit 101 fabricated on the substrate 102, such as a semiconductor substrate, a glass substrate, a thin-film substrate, or the like.

After the application of the direct implant 402, of FIG. 4, the implantation layer 124 and the metal passivation layer 126 may have been formed in the structure surface 202, of FIG. 2. The diffusion barrier layer 112 may be unaffected by the direct implant 402, but is generally not susceptible to the penetration of moisture.

It has been discovered that the implantation layer 124 and the metal passivation layer 126 may be formed concurrently by a single application of the direct implant 402 or the implantation layer 124 and the metal passivation layer 126 may be selectively formed using multiple applications of the direct implant 402.

The dielectric capping layer 128 may be applied on the structure surface 202 to form the structure surface 116. Generally, the dielectric capping layer 128 can be formed by chemical vapor deposition (CVD) at a relatively low temperature, e.g., at about 350° C. or lower, to suppress the growth of a metallization hillock in the copper.

In at least one embodiment, the dielectric capping layer 128 can be formed form silicon oxide, silicon nitride, silicon oxynitride, silicon carbide, and/or nitrogen-doped silicon carbide, for example. Generally, the dielectric capping layer 128 may range in thickness between about 100 Angstroms to about 500 Angstroms, and may have a target thickness in the range of 150 Angstroms and 350 Angstroms. It will be appreciated by those skilled in the art that the dielectric capping layer 128 can help to seal the implantation layer 124 and the metal passivation layer 126 to further resist moisture penetration.

After forming the dielectric capping layer 128, an anneal process can be performed to repair damage to the top surface of the implantation layer 124 and the metal passivation layer 126. It will be appreciated by those skilled in the art that the parameters of the anneal can be manipulated to enhance the inter-mixing of the low-K dielectric layer 110 with the dielectric capping layer 128 to improve the electrical reliability characteristics of the integrated circuit system 600.

Figure 7:
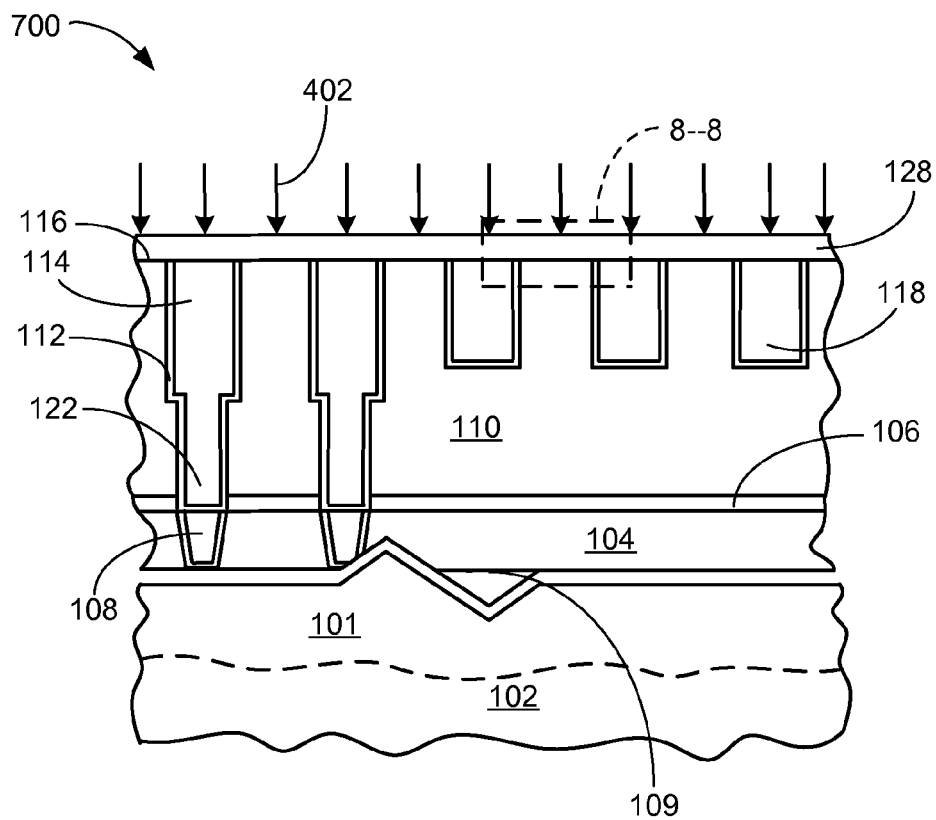
FIG. 7 is a partial cross-sectional view of an integrated circuit system with low-K dielectric, in an alternative embodiment of the present invention.

Referring now to FIG. 7, therein is shown a partial cross-sectional view of an integrated circuit system 700 with low-K dielectric, in an alternative embodiment of the present invention. The partial cross-sectional view of the integrated circuit system 700 depicts the integrated circuit 101 fabricated on the substrate 102, such as a semiconductor substrate, a glass substrate, a thin-film substrate, or the like.

The inter-level dielectric layer 104 is deposited over the integrated circuit 101 and is covered by the cap layer 106, such as silicon nitride (SiN), carbon-doped Silicon nitride, or nitrogen-doped silicon carbide (nBlok). The interconnect 108, such as a copper interconnect, is electrically connected to the integrated circuit 101 through the contact layer 109.

The low-K dielectric layer 110, such as a low-K dielectric material or an ultra low-K dielectric material, is deposited over the inter-level dielectric layer 104 and the cap layer 106. The inter-level dielectric layer 104 and the low-K dielectric layer 110 are substantially similar in the chemical make-up and dielectric value (K).

The inter-level dielectric layer 104 may have dielectric constants from 4.2 to 3.9 and may be composed of materials such as silicon oxide ($SiO_x$), tetraethylorthosilicate (TEOS), borophosphosilicate (BPSG) glass, etc. The low-K dielectric material may have lower dielectric constants from 3.9 to 2.5 and may be composed of materials such as fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), etc. The ultra low-K dielectric material may have ultra-low dielectric constants below 2.5 and may be composed of such materials as polytetrafluoroethylene (PTFE) commercially available as Teflon-AF and Teflon microemulsion, polyimide nanofoams such as polypropylene oxide, silica aerogels, silica xerogels, and mesoporous silica.

The diffusion barrier layer 112, such as a seed metal layer which is deposited on the low-K dielectric layer 110, and inside the patterned interconnect openings. The diffusion barrier layer 112 may include an initial 50-200 Angstrom layer of titanium (Ti), tantalum (Ta) or tantalum nitride (TaN), used as the diffusion barrier, that is covered by a 300-2000 Angstrom layer of copper (Cu). The interconnect metal 114, such as copper, is deposited on the diffusion barrier layer 112. The structure surface 116 is formed by a chemical-mechanical polish establishing a coplanar surface between the interconnect metal 114, the diffusion barrier layer 112, and the low-K dielectric layer 110.

The dielectric capping layer 128 may be formed on the structure surface 116 to have a thickness of between about 100 Angstroms to about 500 Angstroms. It will be appreciated by those skilled in the art that the dielectric capping layer 128 can help to passivate the top surface of the interconnect metal 114 and the low-K dielectric layer 110.

After forming the dielectric capping layer 128, the integrated circuit system 700 can then be subjected to the direct implant 402 to alter the electrical reliability characteristics that may have been detrimentally affected by the CMP process upon the low-K dielectric layer 110. By way of example, the direct implant 402 may include dopants, such as inert elements (e.g., helium), electron scavengers (e.g., carbon, boron, and similar elements.), and/or negative elements (e.g., nitrogen, phosphorus, arsenic, and similar elements). In such cases, the dopant selection can be based upon minimum damage or impact to the low-K dielectric layer 110, low-k dielectric material damage recovery, and/or a minimization of the change of the dielectric constant (K) value of the low-K dielectric layer 110.

It is to be understood that the doped region or the dopant profile within the low-K dielectric layer 110 and the interconnect metal 114 can be adjusted and/or modulated by altering the implant energy, dose, and/or angle. By way of example, the implant energy may vary from about 1 K eV to about 1 M eV and the dosage of the direct implant 402 may vary from about $1 \times 10^{12}$ to about $1 \times 10^{18}$ ions/cm². In such cases, the concentration of the dopant within the low-K dielectric layer 110 and the interconnect metal 114 may range from about 1 part per billion to about 1000 parts per million.

However, it will be appreciated by those skilled in the art that the implant can be tuned to only dope the low-k dielectric material with a dopant range from about 1 part per billion to about 1000 parts per million. In at least one embodiment, the implant energy may preferably vary between about 5 keV to about 20 keV when the cap layer is present.

It will be appreciated by those skilled in the art that selective doping of the low-K dielectric layer 110 may help to enhance the material and/or top surface for better reliability without degrading the interconnect metal 114 conductivity. As is known in the art, dopants typically increase the resistivity of metal structures, which is not preferable in advanced semiconductor device processes where lower resistance is required.

Generally, the implantation can form the doped region within the low-K dielectric layer 110 or the interconnect metal 114 with a depth of about 5 Angstroms to about 500 Angstroms and preferably between about 15 Angstroms to about 150 Angstroms.

It will be appreciated by those skilled in the art that by implanting the integrated circuit system 700 through the dielectric capping layer 128 that the direct implant 402 may cause an inter-mixing of the dielectric capping layer 128, the low-K dielectric layer 110, and/or the dopant of the direct implant 402. It has been discovered that this inter-mixing of the low-K dielectric layer 110, the dielectric capping layer 128, and/or the dopant of the direct implant 402 produces a firm interface region that helps to improve the TDDB of the low-K dielectric layer 110.

In at least one embodiment, the inter-mixing produces a chemical reaction between the dopant element of the direct implant 402 and the low-K dielectric layer 110, such as silicon, of the dielectric capping layer 128 and the low-K dielectric layer 110. In such cases, the chemical reaction at the structure surface 116 can form chemically stable bonds, e.g., SiN, when nitrogen is chosen to be the dopant element used in the direct implant 402. In other embodiments, the implantation may modify the morphology of the low-K dielectric layer 110 and the dielectric capping layer 128 to produce an interface region that helps to repair the damage caused by CMP.

It will be appreciated by those skilled in the art that the present embodiment permits a self-aligned dielectric passivation, while reducing direct surface damage to the low-K dielectric layer 110, especially when using ultra low-K dielectric materials. For example, a copper-tungsten-phosphorous (CuWP) compound can be formed at a surface of the interconnect metal 114 for self-aligning purposes. It will be appreciated by those skilled in the art that CuWP can be chemically stable and serve as a barrier, thereby preventing copper from further reacting or diffusing.

Furthermore, it will be appreciated by those skilled in the art that impurity or unknown chemical bonding formation from CVD processes can be avoided. For example, the current processes and/or structures described herein can be implemented without utilizing nitrogen fluoride to pre-clean the chamber before deposition. It is to be understood that a nitrogen fluoride pre-clean may react with the interconnect metal 114, thereby detrimentally altering surface passivation of the interconnect metal 114.

Figure 8:
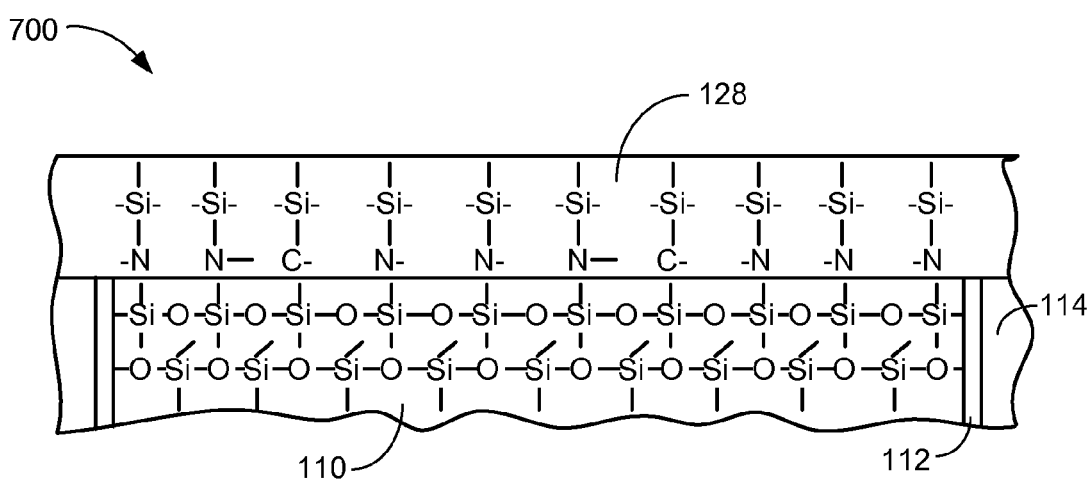
FIG. 8 is a schematic of the chemical bonds at a segment of the structure surface 116 of the integrated circuit system, of FIG. 7, in a post-implantation phase of manufacturing.

An outlined box 8-8 depicts a segment of the structure surface 116 as shown in FIG. 8 below. The segment generally represents the interface state around the structure surface 116 after the application of the direct implant 402 through the dielectric capping layer 128.

Referring now to FIG. 8, therein is shown a schematic of the chemical bonds at a segment of the structure surface 116 of the integrated circuit system 700, of FIG. 7, in a post-implantation phase of manufacturing. The schematic of the chemical bonds at a segment of the structure surface 116 depicts the low-K dielectric layer 110 bounded on the horizontal ends by the diffusion barrier layer 112 and the interconnect metal 114 it is also bounded in the vertical direction by the dielectric capping layer 128. It is noted that the interconnect metal 114 may represent the via 122, of FIG. 1, the trench 118, of FIG. 1, or a combination thereof.

It will be appreciated by those skilled in the art that FIG. 8 depicts an exemplary schematic of the bonding state and/or chemical bonds within the top layers of the integrated circuit system 700 after application of the direct implant 402 through the dielectric capping layer 128. It has been discovered that enhancement of the interface between the dielectric capping layer 128 and the low-K dielectric layer 110 can occur physically (e.g., morphology and roughness) and chemically. In at least one embodiment, it is believed that the improvement of the interface predominantly occurs chemically via chemical-bond changes.

By way of example, when carbon (C) is the implanted element, oxygen (O) in the silicon-oxygen (Si—O) bonds can be replaced by carbon (C) to form silicon-carbon (Si—C) bonds. It is to be understood that under normal conditions for the dielectric capping layer 128 that silicon-nitride (Si—N) can be the predominant chemical bond with some residual silicon-oxide (Si—O) bonds co-existing.

It will be appreciated by those skilled in the art that a carbon element dopant implanted by the direct implant 402 may provide carbon that can replace oxygen within some of the chemical bonds. As a result, silicon-carbon (Si—C) and carbon-nitrogen (C—N) bonds are formed as illustrated, which provides a better metal diffusion barrier, for metals such as copper and the like.

Generally, the implantation processes of the proposed embodiments described herein provide an improved decrease in the capacitance of the low-K dielectric layer 110 and the dielectric capping layer 128. It will be appreciated by those skilled in the art that the significance of the manipulation of capacitance, to increase or decrease it, may also serve as a measure for capacitance tuning for back-end-of-line device structures, such as metal-insulator-metal (MIM) capacitors or vertical-nature-capacitors (VNCAP). It has been discovered that the implanted element and its concomitant physical and chemical effects help to decrease the dielectric constant (K) of the low-K dielectric layer 110 and the dielectric capping layer 128, thereby decreasing the capacitance. The decrease in capacitance between the via 122 and the trench 118 reduces the incidence of cross coupling of signals and allows better impedance control of the interconnect structures (not shown).

Figure 9:
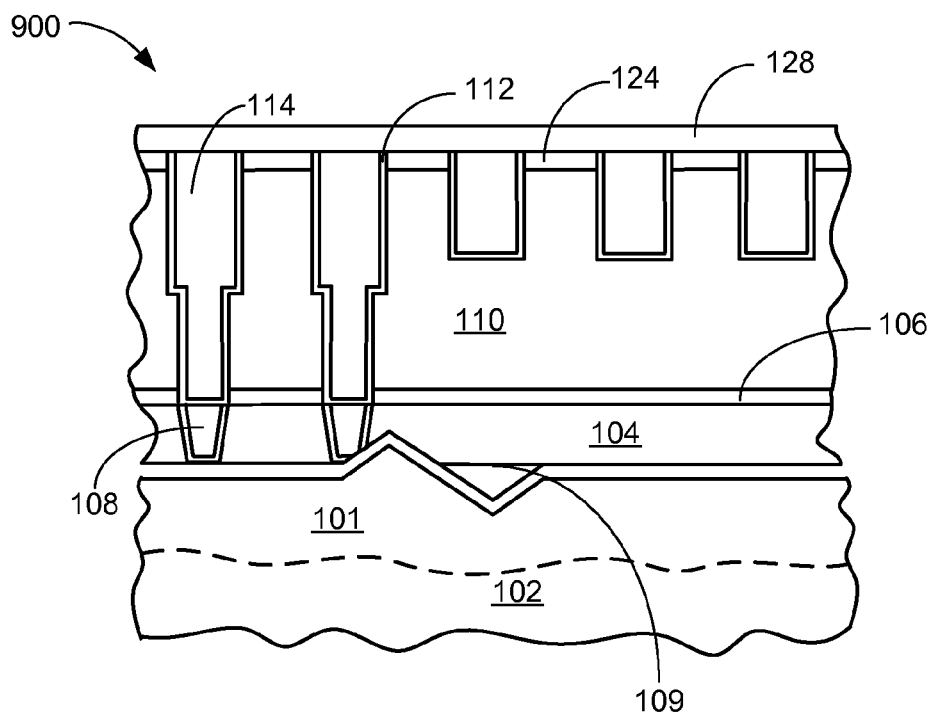
FIG. 9 is a partial cross-sectional view of an integrated circuit system with low-K dielectric, in an alternative embodiment of the present invention.

Referring now to FIG. 9, therein is shown a partial cross-sectional view of an integrated circuit system 900 with low-K dielectric, in an alternative embodiment of the present invention. The partial cross-sectional view of the integrated circuit system 900 depicts the integrated circuit 101 fabricated on the substrate 102, such as a semiconductor substrate, a glass substrate, a thin-film substrate, or the like.

The inter-level dielectric layer 104 is deposited over the integrated circuit 101 and is covered by the cap layer 106, such as silicon nitride (SiN), carbon-doped Silicon nitride, or nitrogen-doped silicon carbide (nBlok). The interconnect 108, such as a copper interconnect, is electrically connected to the integrated circuit 101 through the contact layer 109.

The low-K dielectric layer 110, such as a low-K dielectric material or an ultra low-K dielectric material, is deposited over the inter-level dielectric layer 104 and the cap layer 106. The inter-level dielectric layer 104 and the low-K dielectric layer 110 are substantially similar in the chemical make-up and dielectric value (K).

The inter-level dielectric layer 104 may have dielectric constants from 4.2 to 3.9 and may be composed of materials such as silicon oxide ($SiO_x$), tetraethylorthosilicate (TEOS), borophosphosilicate (BPSG) glass, etc. The low-K dielectric material may have lower dielectric constants from 3.9 to 2.5 and may be composed of materials such as fluorinated tetra-ethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), etc. The ultra low-K dielectric material may have ultra-low dielectric constants below 2.5 and may be composed of such materials as polytetrafluoroethylene (PTFE) commercially available as Teflon-AF and Teflon microemulsion, polyimide nanofoams such as polypropylene oxide, silica aerogels, silica xerogels, and mesoporous silica.

The diffusion barrier layer 112, such as a seed metal layer which is deposited on the low-K dielectric layer 110, and inside the patterned interconnect openings. The diffusion barrier layer 112 may include an initial 50-200 Angstrom layer of titanium (Ti), tantalum (Ta) or tantalum nitride (TaN), used as the diffusion barrier, that is covered by a 300-2000 Angstrom layer of copper (Cu). The interconnect metal 114, such as copper, is deposited on the diffusion barrier layer 112. The structure surface 116 is formed by a chemical-mechanical planarization establishing a coplanar surface between the interconnect metal 114, the diffusion barrier layer 112, and the low-K dielectric layer 110.

The dielectric capping layer 128 may be formed on the structure surface 116 to have a thickness of between about 100 Angstroms to about 500 Angstroms. It will be appreciated by those skilled in the art that the dielectric capping layer 128 can help to passivate the top surface of the interconnect metal 114 and the low-K dielectric layer 110.

After forming the dielectric capping layer 128, the integrated circuit system 700 can then be subjected to the direct implant 402 to alter the electrical reliability characteristics that may have been detrimentally affected by the CMP process upon the low-K dielectric layer 110. By way of example, the direct implant 402 may include dopants, such as inert elements (e.g., helium), electron scavengers (e.g., carbon, boron, and similar elements.), and/or negative elements (e.g., nitrogen, phosphorus, arsenic, and similar elements). In such cases, the dopant selection can be based upon minimum damage or impact to the low-K dielectric layer 110, low-k dielectric material damage recovery, and/or a minimization of the change of the dielectric constant (K) value of the low-K dielectric layer 110.

It is to be understood that the doped region or the dopant profile within the low-K dielectric layer 110 and the interconnect metal 114 can be adjusted and/or modulated by altering the implant energy, dose, and/or angle. By way of example, the implant energy may vary from about 1 K eV to about 1 M eV and the dosage of the direct implant 402 may vary from about $1\times10^{12}$ to about $1\times10^{18}$ ions/cm². In such cases, the concentration of the dopant within the low-K dielectric layer 110 and the interconnect metal 114 may range from about 1 part per billion to about 1000 parts per million.

However, it will be appreciated by those skilled in the art that the implant can be tuned to only dope the low-K dielectric layer 110 with a dopant range from about 1 part per billion to about 1000 parts per million. In at least one embodiment, the implant energy may preferably vary between about 5 K eV to about 20 K eV when the cap layer is present.

Subsequent to forming the implant through the dielectric capping layer 128, an anneal process can be performed to repair damage to the top surface of the low-K dielectric layer 110 and the interconnect metal 114. It will be appreciated by those skilled in the art that the parameters of the anneal can be manipulated to enhance the inter-mixing of the low-K dielectric layer 110 with the dielectric capping layer 128 to improve the electrical reliability of the integrated circuit system 900. By way of example, after annealing, TDDB, capacitance, leakage current, and electro-migration can be improved over that of a control device without applying the direct implant 402 to the low-K dielectric layer 110.

Figure 10:
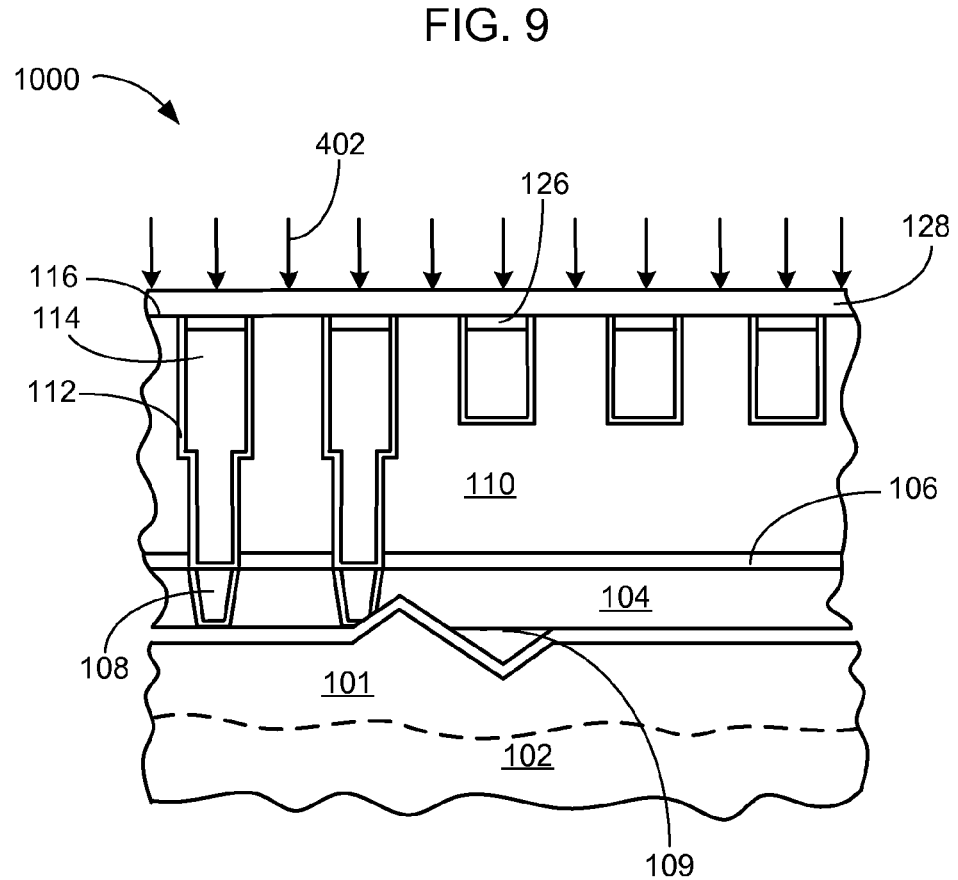
FIG. 10 is a partial cross-sectional view of an integrated circuit system with low-K dielectric, in a second alternative embodiment of the present invention.

Referring now to FIG. 10, therein is shown a partial cross-sectional view of an integrated circuit system 1000 with low-K dielectric, in a second alternative embodiment of the present invention. The partial cross-sectional view of the integrated circuit system 1000 depicts the integrated circuit 101 fabricated on the substrate 102, such as a semiconductor substrate, a glass substrate, a thin-film substrate, or the like.

The inter-level dielectric layer 104 is deposited over the integrated circuit 101 and is covered by the cap layer 106, such as silicon nitride (SiN), carbon-doped Silicon nitride, or nitrogen-doped silicon carbide (nBlok). The interconnect 108, such as a copper interconnect, is electrically connected to the integrated circuit 101 through the contact layer 109.

The low-K dielectric layer 110, such as a low-K dielectric material or an ultra low-K dielectric material, is deposited over the inter-level dielectric layer 104 and the cap layer 106. The inter-level dielectric layer 104 and the low-K dielectric layer 110 are substantially similar in the chemical make-up and dielectric value (K).

The inter-level dielectric layer 104 may have dielectric constants from 4.2 to 3.9 and may be composed of materials such as silicon oxide ($SiO_x$), tetraethylorthosilicate (TEOS), borophosphosilicate (BPSG) glass, etc. The low-K dielectric material may have lower dielectric constants from 3.9 to 2.5 and may be composed of materials such as fluorinated tetra-ethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), etc. The ultra low-K dielectric material may have ultra-low dielectric constants below 2.5 and may be composed of such materials as polytetrafluoroethylene (PTFE) commercially available as Teflon-AF and Teflon microemulsion, polyimide nanofoams such as polypropylene oxide, silica aerogels, silica xerogels, and mesoporous silica.

The diffusion barrier layer 112, such as a seed metal layer which is deposited on the low-K dielectric layer 110, and inside the patterned interconnect openings. The diffusion barrier layer 112 may include an initial 50-200 Angstrom layer of titanium (Ti), tantalum (Ta) or tantalum nitride (TaN), used as the diffusion barrier, that is covered by a 300-2000 Angstrom layer of copper (Cu). The interconnect metal 114, such as copper, is deposited on the diffusion barrier layer 112. The structure surface 116 is formed by a chemical-mechanical polish establishing a coplanar surface between the interconnect metal 114, the diffusion barrier layer 112, and the low-K dielectric layer 110.

A selective passivation may be performed on the interconnect metal 114 for forming the metal passivation layer 126. The metal passivation layer 126 may have a thickness in the range of 5 Angstroms to 250 Angstroms, with a target thickness in the range of 15 Angstroms and 50 Angstroms.

The dielectric capping layer 128 may be formed on the structure surface 116 to have a thickness of between about 500 Angstroms or less. It will be appreciated by those skilled in the art that the dielectric capping layer 128 can help to passivate the top surface of the low-K dielectric layer 110 while helping to further passivate the metal passivation layer 126.

After forming the dielectric capping layer 128, the integrated circuit system 1000 can then be subjected to the direct implant 402 to alter the electrical reliability characteristics that may have been detrimentally affected by the CMP process upon the low-K dielectric layer 110. By way of example, the direct implant 402 may include dopants, such as inert elements (e.g., helium), electron scavengers (e.g., carbon, boron, and similar elements.), and/or negative elements (e.g., nitrogen, phosphorus, arsenic, and similar elements). In such cases, the dopant selection can be based upon minimum damage or impact to the low-K dielectric layer 110, low-k dielectric material damage recovery, and/or a minimization of the change of the dielectric constant (K) value of the low-K dielectric layer 110.

It is to be understood that the doped region or the dopant profile within the low-K dielectric layer 110 and the interconnect metal 114 can be adjusted and/or modulated by altering the implant energy, dose, and/or angle. By way of example, the implant energy may vary from about 1 KeV to about 1 M eV and the dosage of the direct implant 402 may vary from about $1 \times 10^{12}$ to about $1 \times 10^{18}$ ions/cm$^2$. In such cases, the concentration of the dopant within the low-K dielectric layer 110 and the interconnect metal 114 may range from about 1 part per billion to about 1000 parts per million.

However, it will be appreciated by those skilled in the art that the implant can be tuned to only dope the low-k dielectric material with a dopant range from about 1 part per billion to about 1000 parts per million. In at least one embodiment, the implant energy may preferably vary between about 5 keV to about 20 keV when the cap layer is present.

Generally, the application of the direct implant 402 can form the implantation layer 124 or the metal passivation layer 126 with a depth of about 5 Angstroms to about 500 Angstroms and preferably between about 15 Angstroms to about 150 Angstroms.

It will be appreciated by those skilled in the art that selective doping of the low-K dielectric layer 110 may help to enhance the material and/or top surface for better reliability without degrading the interconnect metal 114 conductivity. As is known in the art, dopants typically increase the resistivity of metal structures, which is not preferable in advanced semiconductor device processes where lower resistance is required.

It will be appreciated by those skilled in the art that by implanting the integrated circuit system 1000 through the dielectric capping layer 128 that the implanted dopant may cause an inter-mixing of the cap layer and the low-k dielectric material. It has been discovered that this inter-mixing of the low-k dielectric layer 110 and the dielectric capping layer 128 produces a firm interface region that helps to improve the TDDB of the low-k dielectric layer 110 and also helps to repair any damage that may have been caused by CMP.

It will be appreciated by those skilled in the art that the present embodiment permits a self-aligned dielectric passivation and metallization structure passivation to be achieved separately. For example, by selectively forming the metal passivation layer 126 over the interconnect metal 114 before implantation, the implanted dopant can then be selectively introduced into the implantation layer 124, thereby achieving a "self-aligned dielectric passivation" process.

Figure 11:
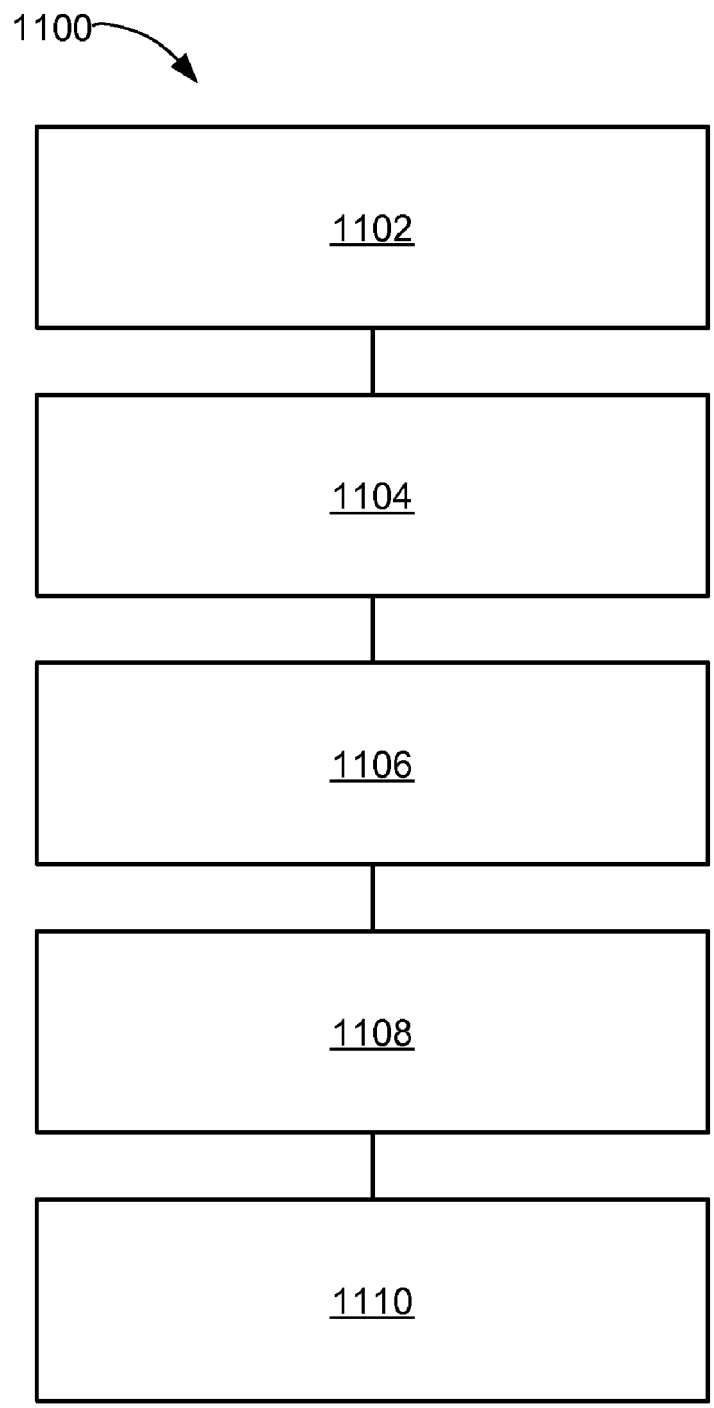
FIG. 11 is a flow chart of a method of manufacture of an integrated circuit system in an embodiment of the present invention.

Referring now to FIG. 11, therein is shown a flow chart of a method 1100 of manufacture of the integrated circuit system 100 in an embodiment of the present invention. The method 1100 includes: fabricating a substrate having an integrated circuit in a block 1102; applying a low-K dielectric layer over the integrated circuit in a block 1104; forming a via and a trench, in the low-K dielectric layer, over the integrated circuit in a block 1106; forming a structure surface by a chemical-mechanical planarization (CMP) process in a block 1108; and applying a direct implant to the structure surface for forming an implant layer and a metal passivation layer including repairing damage, to the low-K dielectric layer, caused by the CMP process in a block 1110.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
    fabricating a substrate having an integrated circuit;
    applying a low-K dielectric layer over the integrated circuit;
    forming a via and a trench, in the low-K dielectric layer, over the integrated circuit;
    forming a structure surface by a chemical-mechanical planarization (CMP) process; and
    applying a direct implant through the structure surface for forming an implant layer and a metal passivation layer including repairing damage, to the low-K dielectric layer, caused by the CMP process.

2. The method as claimed in claim 1 further comprising forming a dielectric capping layer on the structure surface.

3. The method as claimed in claim 1 further comprising depositing an interconnect metal in the low-K dielectric layer for forming the via and the trench.

4. The method as claimed in claim 1 wherein forming the via and the trench includes depositing a diffusion barrier layer on an opening in the low-K dielectric layer.

5. The method as claimed in claim 1 wherein applying the direct implant through the surface structure includes implanting an inert element, an electron scavenger, a negative element, or a combination thereof classified to be a non-metal or a metalloid for physically and chemically altering the implant layer and the metal passivation layer.

6. A method of manufacture of an integrated circuit system comprising:
fabricating a substrate having an integrated circuit;
applying a low-K dielectric layer over the integrated circuit including applying a low-K dielectric material or an ultra low-K dielectric material for forming the low-K dielectric layer;
forming a via and a trench, in the low-K dielectric layer, over the integrated circuit;
forming a structure surface by a chemical-mechanical planarization (CMP) process including forming a planar surface including the via, the trench, and the low-K dielectric layer;
forming a dielectric capping layer above the structure surface; and
applying a direct implant through the dielectric capping layer and through the structure surface for forming an implant layer and a metal passivation layer including repairing damage, to the low-K dielectric layer, caused by the CMP process.

7. The method as claimed in claim 6 further comprising depositing an interconnect metal in the low-K dielectric layer for forming the via and the trench including depositing copper for the interconnect metal.

8. The method as claimed in claim 6 wherein forming the via and the trench includes depositing a diffusion barrier layer on an opening in the low-K dielectric layer including forming a vertical sidewall in the low-K dielectric layer for the via and the trench.

9. The method as claimed in claim 6 wherein applying the direct implant through the surface structure by implanting a dopant for physically and chemically altering the implant layer and the metal passivation layer including preventing time-dependent-dielectric-breakdown (TDDB) and electromigration (EM).

10. An integrated circuit system comprising:
a substrate having an integrated circuit;
a low-K dielectric layer over the integrated circuit;
a via and a trench over the integrated circuit;
a structure surface formed, by a chemical-mechanical planarization (CMP) process, on the via, the trench, and the low-K dielectric layer; and
an implant layer and a metal passivation layer below the structure surface formed by a direct implant through the structure surface.

11. The system as claimed in claim 10 further comprising a dielectric capping layer on the structure surface.

12. The system as claimed in claim 10 further comprising an interconnect metal deposited in the low-K dielectric layer for the via and the trench.

13. The system as claimed in claim 10 wherein the via and the trench formed in the low-K dielectric layer includes a diffusion barrier layer on an opening in the low-K dielectric layer.

14. The system as claimed in claim 10 wherein the implant layer and the metal passivation layer formed by the direct implant through the structure surface includes an inert element, an electron scavenger, a negative element, or a combination thereof classified to be a non-metal or a metalloid implanted for physically and chemically altering the implant layer and the metal passivation layer.

15. The system as claimed in claim 10 further comprising:
a low-K dielectric material or an ultra low-K dielectric material in the low-K dielectric layer; and
a planar surface formed by the CMP process includes the via, the trench and the low-K dielectric layer are coplanar.

16. The system as claimed in claim 15 further comprising a dielectric capping layer on the structure surface.

17. The system as claimed in claim 15 further comprising an interconnect metal deposited in the low-K dielectric layer for the via and the trench includes the interconnect metal is copper.

18. The system as claimed in claim 15 wherein the via and the trench formed in the low-K dielectric layer includes a diffusion barrier layer on an opening in the low-K dielectric layer with a vertical sidewall formed in the low-K dielectric layer.

19. The system as claimed in claim 10 wherein the implant layer and the metal passivation layer formed by the direct implant through the structure surface includes an inert element, an electron scavenger, a negative element, or a combination thereof classified to be a non-metal or a metalloid implanted for physically and chemically altering the implant layer and the metal passivation layer.

* * * * *